(12) United States Patent
Saki et al.

(10) Patent No.: US 7,082,346 B2
(45) Date of Patent: Jul. 25, 2006

(54) SEMICONDUCTOR MANUFACTURING APPARATUS AND SEMICONDUCTOR DEVICE MANUFACTURING METHOD

(75) Inventors: Kazuo Saki, Yokohama (JP); Yukihiro Ushiku, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 55 days.

(21) Appl. No.: 10/457,353

(22) Filed: Jun. 10, 2003

(65) Prior Publication Data
US 2004/0044419 A1  Mar. 4, 2004

Related U.S. Application Data

(63) Continuation of application No. PCT/JP02/10436, filed on Oct. 8, 2002.

(30) Foreign Application Priority Data
Oct. 11, 2001 (JP) .............................. 2001-313918

(51) Int. Cl.
*G06F 19/00* (2006.01)

(52) U.S. Cl. .................... 700/121; 700/121; 700/2; 438/541; 156/345.26

(58) Field of Classification Search ............... 700/121, 700/2; 438/541; 156/345.26
See application file for complete search history.

(56) References Cited

U.S. PATENT DOCUMENTS

| | | | | |
|---|---|---|---|---|
| 5,994,209 | A | * 11/1999 | Yieh et al. ................... | 438/541 |
| 6,240,330 | B1 | 5/2001 | Kurtzberg et al. | |
| 6,772,034 | B1 | * 8/2004 | Shi et al. ..................... | 700/121 |
| 6,802,933 | B1 | * 10/2004 | Khan et al. ............ | 156/345.26 |
| 6,913,938 | B1 | * 7/2005 | Shanmugasundram et al. .. | 438/16 |

FOREIGN PATENT DOCUMENTS

| | | |
|---|---|---|
| JP | 63-318130 | 12/1988 |
| JP | 08-055145 | 2/1996 |
| JP | 09-017705 | 1/1997 |
| JP | 11-042537 | 2/1999 |
| JP | 11-288856 | 10/1999 |

* cited by examiner

*Primary Examiner*—Anthony Knight
*Assistant Examiner*—Sunray Chang
(74) *Attorney, Agent, or Firm*—Finnegan, Henderson, Farabow, Garrett & Dunner, L.L.P.

(57) ABSTRACT

A semiconductor manufacturing apparatus which continuously executes oxidation and CVD in a multiprocess apparatus includes an internal apparatus controller which selects the type of process and supplies a start signal and stop signal for the process to the multiprocess apparatus, and a process controller which calculates the process state for each process on the basis of the internal information of the apparatus. Upon receiving the stop signal from the controller, the controller sends the stop signal to the multiprocess apparatus to stop the current process by the multiprocess apparatus and switches to the next process.

16 Claims, 5 Drawing Sheets

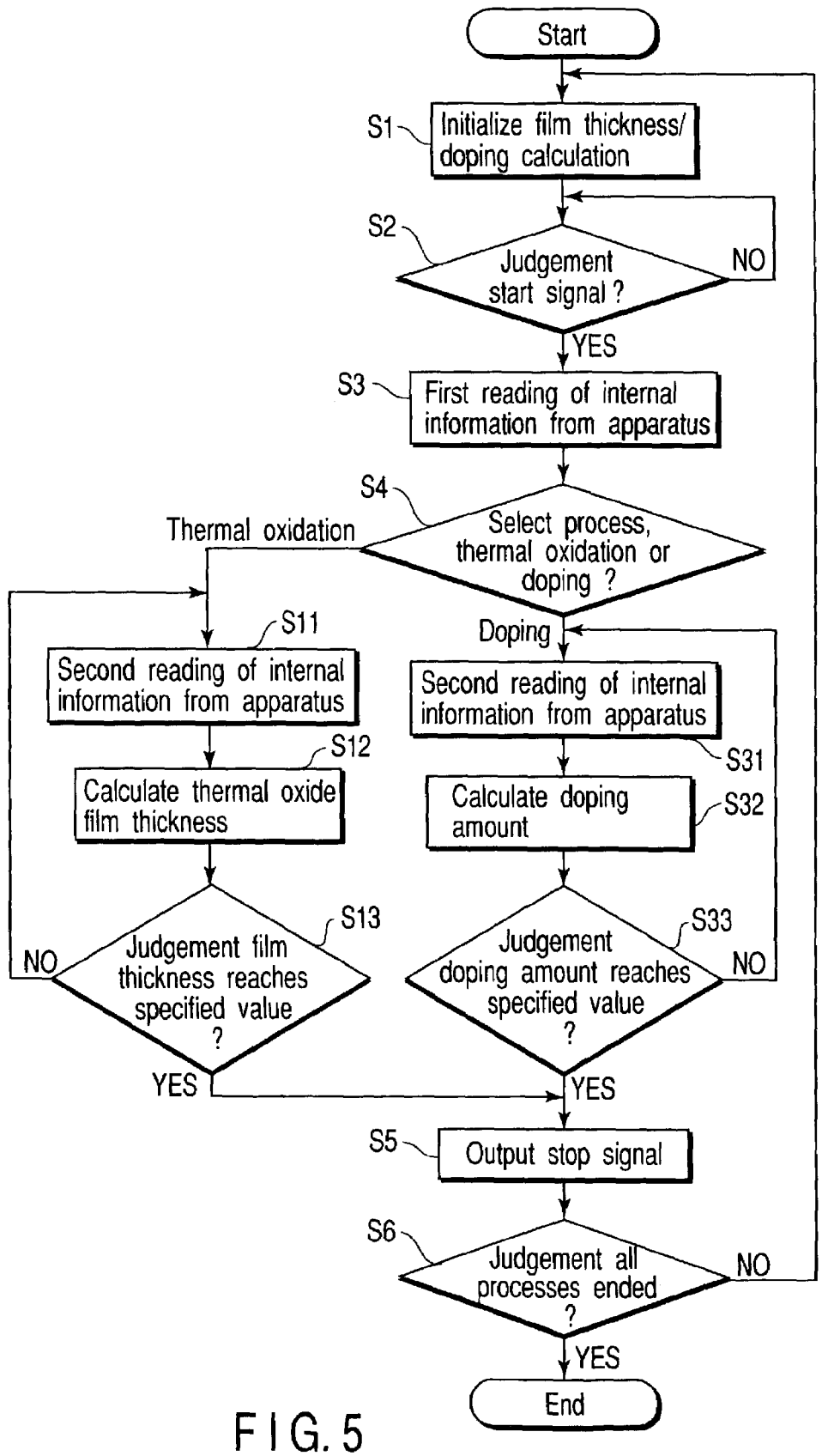
F I G. 5

SEMICONDUCTOR MANUFACTURING APPARATUS AND SEMICONDUCTOR DEVICE MANUFACTURING METHOD

CROSS-REFERENCE TO RELATED APPLICATIONS

This is a Continuation Application of PCT Application No. PCT/JP02/10436, filed Oct. 8, 2002, which was not published under PCT Article 21(2) in English.

This application is based upon and claims the benefit of priority from the prior Japanese Patent Application No. 2001-313918, filed Oct. 11, 2001, the entire contents of which are incorporated herein by reference.

BACKGROUND OF THE INVENTION

1. Field of the Invention

The present invention relates to a semiconductor manufacturing technique and, more particularly, to a semiconductor manufacturing apparatus which executes a plurality of processes such as an oxidation, a diffusion, and CVD (a Chemical Vapor Deposition) in a single chamber and a semiconductor device manufacturing method using the semiconductor manufacturing apparatus.

2. Description of the Related Art

In recent years, a technique for continuously executing a plurality of processes in a single chamber has been developed aiming at shortening the wafer process time in a semiconductor manufacturing apparatus. In such an apparatus, accurate control related to a film thickness and an impurity diffusion is required for the plurality of processes in the single chamber.

FIG. 7 is a flow chart showing the continuous process flow of the film formation process of an oxide film and SiN film based on a prior art. First, on the basis of technical experiences, the oxide film formation temperature, the oxidation gas flow rate, the oxidation time, the SiN deposition temperature, the SiN deposition time, the gas pressure in SiN film formation, the SiN film formation gas flow rate, and the like are input to the control computer of a semiconductor manufacturing apparatus (in this case, an oxidation/CVD furnace) by some means such that desired film thicknesses can be obtained, respectively. Next, a start signal is input by some means to start the process.

Processes such as a wafer loading into the apparatus, a heating up, a temperature retention, gas supplies, gas switchings, a cooling down, and a wafer unloading are performed in accordance with the set sequence. During the processes, the temperature in the furnace and the gas flow rate are kept at the set values as exactly as possible, and the oxidation time and deposition time are controlled, thereby obtaining the desired film thicknesses.

In the above sequence, however, a fluctuation in film thickness or a fluctuation in impurity dose due to uncontrollable disturbance factors in the apparatus or a fluctuation in film thickness or a fluctuation in impurity dose due to uncontrollable disturbance factors outside of the apparatus are not taken into consideration at all. Examples of uncontrollable disturbance factors in the apparatus are a slight change in temperature in heating due to the influence of the process temperature for the preceding batch and a very small change in gas flow rate due to a slight variation in supply voltage. An example of uncontrollable disturbance factors outside the apparatus is a change in the atmospheric pressure.

Since a feature size of devices is becoming finer, and these disturbance factors cannot be neglected nowadays, no sufficient element device performance and circuit characteristics can be obtained with the conventional film formation technique. For this reason, a semiconductor manufacturing apparatus control method that takes these disturbance factors into consideration has been demanded. In addition, since film thickness measurement, which is performed after the process, is not performed after the first film formation in the continuous process, more accurate film formation control is required.

To examine the influence of the above disturbance factors on the film thickness or impurity diffusion, calculation or simulation for an oxidation, a deposition, and an impurity diffusion is necessary. For example, Jpn. Pat. Appln. KOKAI Publication Nos. 11-288856 and 8-55145 describe ideas for comparing actual manufacturing data with simulated data. However, the purpose of comparison in these prior arts is to improve the accuracy of simulation or adjust simulated data to actual manufacturing data, which is anything but a proposal from the viewpoint of manufacturing control in changing manufacturing conditions or manufacturing parameters. In addition, no calculation is performed presuming disturbances inside and outside of the apparatus, so a variation in manufacturing each cycle is not taken into consideration.

As described above, in the conventional semiconductor manufacturing apparatus which continuously executes a plurality of processes related to manufacturing of a semiconductor device in a single chamber, a fluctuation in film thickness or a fluctuation in impurity dose due to uncontrollable disturbance factors in the apparatus or a fluctuation in film thickness or a fluctuation in impurity dose due to uncontrollable disturbance factors such as the atmospheric pressure outside of the apparatus occurs. For this reason, no sufficient element device performance and circuit characteristics can be obtained.

BRIEF SUMMARY OF THE INVENTION

According to an aspect of the present invention to provide a semiconductor manufacturing apparatus comprises: a processing apparatus main body which continuously executes a plurality of processes related to manufacturing of a semiconductor device in a single chamber; an apparatus controller unit which selects a type of process in the processing apparatus main body and supplies a start signal to start a process and a stop signal to stop the process to the processing apparatus main body; a first terminal to output internal information of the processing apparatus main body to an outside; a second terminal to output the start signal from the apparatus controller section to the outside; and a third terminal to receive the start signal from the second terminal and input to the apparatus controller unit the stop signal based on a result obtained by calculating the process state for the current process on the basis of the internal information of the apparatus, wherein the apparatus controller unit sends the stop signal to the processing apparatus main body upon receiving the stop signal through the third terminal, stops the current process in the processing apparatus main body, and switches to the next process.

According to another aspect of the present invention to provide a semiconductor manufacturing apparatus comprises: a processing apparatus main body which continuously executes a plurality of processes related to manufacturing of a semiconductor device in a single chamber; an apparatus controller unit which selects a type of process in the processing apparatus main body and supplies a start signal to start a process and a stop signal to stop the process to the processing apparatus main body; and a process controller unit which has a function of calculating process states for said plurality of processes on the basis of internal information of the processing apparatus main body, starts calculating the process state for the current process at a timing when the start signal is sent from the apparatus controller unit, and sends the stop signal to the apparatus controller unit when the process state reaches a specified state, wherein the apparatus controller unit sends the stop signal to the processing apparatus main body upon receiving the stop signal from the process controller unit, stops the current process by the processing apparatus main body, and switches to the next process.

According to still another aspect of the present invention to provide a semiconductor device manufacturing method of executing a predetermined process for a substrate to be processed using a semiconductor manufacturing apparatus comprising a processing apparatus main body which continuously executes a plurality of processes related to manufacturing of a semiconductor device in a single chamber, an apparatus controller unit which selects a type of process in the processing apparatus main body and controls a start and stop of the process, and a process controller unit which has a function of calculating process states for said plurality of processes on the basis of internal information of the processing apparatus main body, said method comprises: while the substrate to be processed is set in the processing apparatus main body, causing the apparatus controller unit to start the predetermined process, causing the process controller unit to start calculating a process state for the current process, and when it is judged on the basis of a calculation result that the process state reaches a specified state, causing the apparatus controller unit to stop the current process and switch to the next process.

BRIEF DESCRIPTION OF THE SEVERAL VIEWS OF THE DRAWING

FIG. 5 is a flow chart showing process control operation according to the second embodiment;

DETAILED DESCRIPTION OF THE INVENTION

The present invention will be described below in detail on the basis of the illustrated embodiments.

First Embodiment

Figure 1:
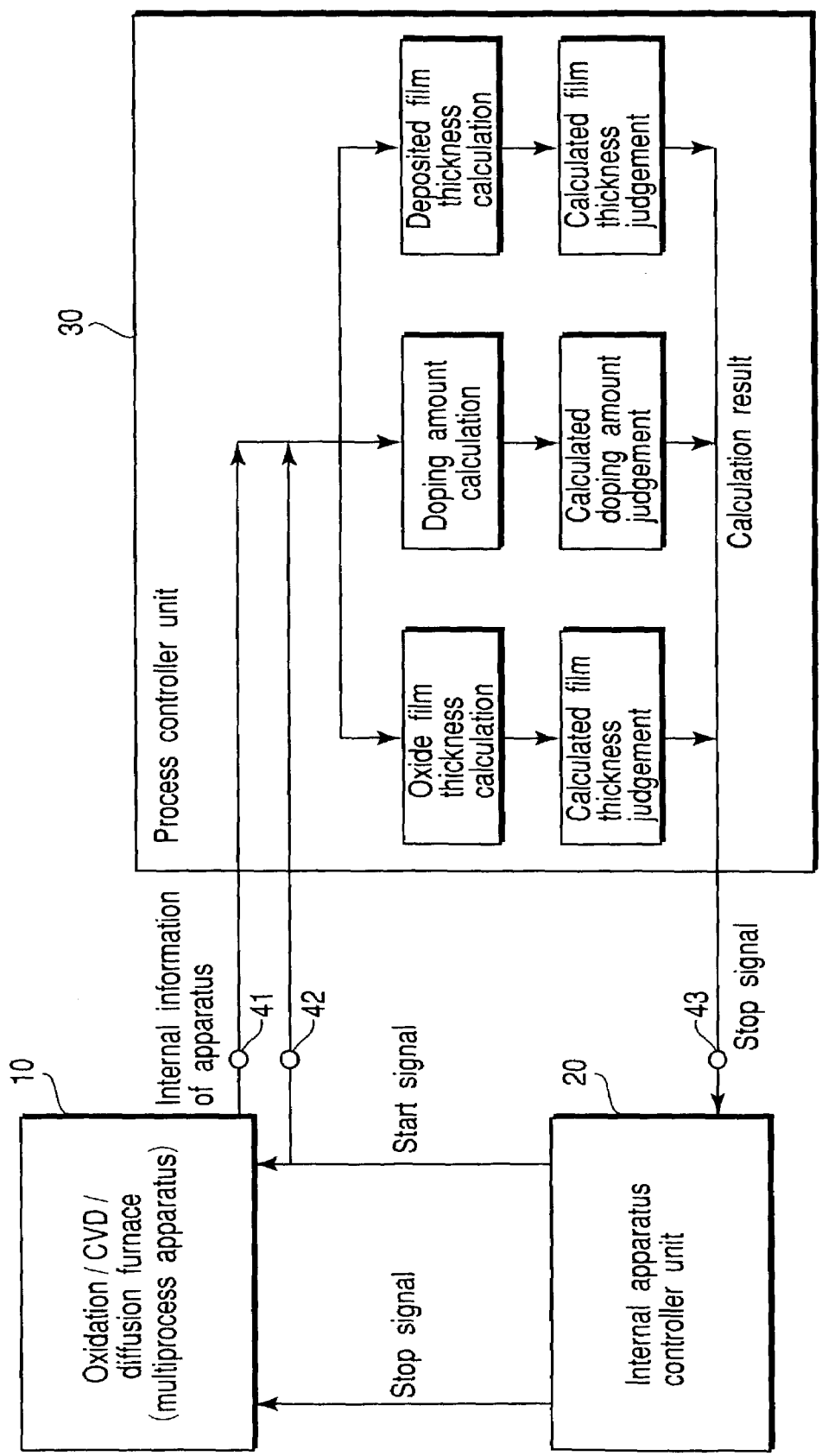
FIG. 1 is a block diagram showing the basic arrangement of a semiconductor manufacturing apparatus according to the first embodiment.

FIG. 1 is a block diagram showing the basic arrangement of a semiconductor manufacturing apparatus according to the first embodiment of the present invention. Note that the semiconductor manufacturing apparatus of this embodiment can be applied to either a batch processing apparatus or a single wafer processing apparatus.

Referring to FIG. 1, a chamber 10 continuously executes a plurality of processes and is constituted by, e.g., an oxidation/diffusion/CVD furnace (to be referred to as a multiprocess apparatus hereinafter). An internal apparatus controller (apparatus controller unit) 20 controls the multiprocess apparatus 10. A process controller unit 30 has a film thickness calculation function, a doping amount calculation function, a calculated film thickness judgment function, a calculated doping amount judgment function, and the like.

Figure 2:
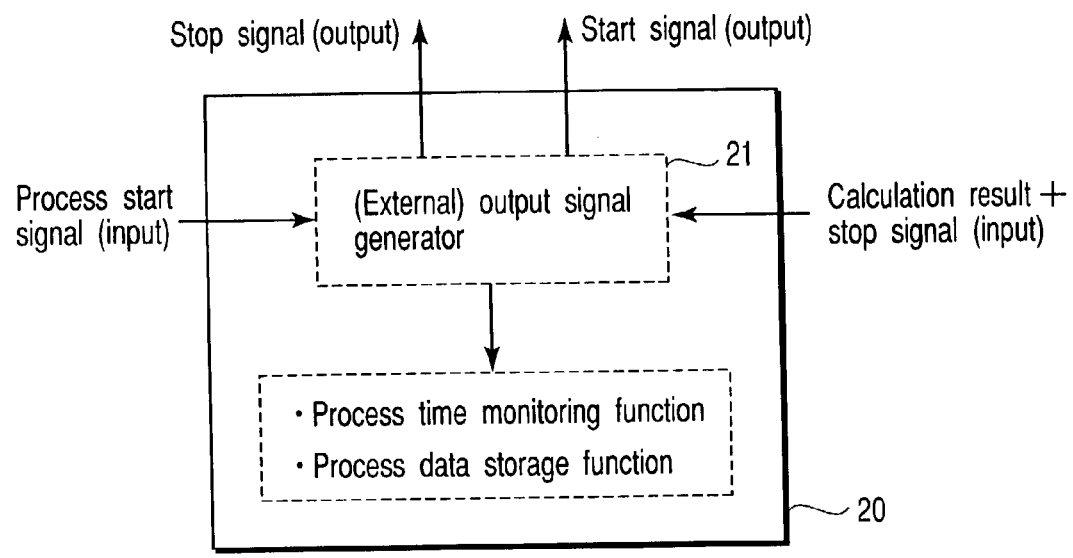
FIG. 2 is a view showing the arrangement of an apparatus controller unit used in the semiconductor manufacturing apparatus shown in FIG. 1.

As shown in FIG. 2, the internal apparatus controller 20 has an external output signal generator 21 having a process time monitoring function, a process data storage function, and the like. Upon receiving a calculation result and a stop signal from the process controller unit 30, the external output signal generator 21 outputs a stop signal to the multiprocess apparatus 10. In addition, upon receiving a process start signal by user input, or a predetermined time after the output of the stop signal, the external output signal generator 21 sends a start signal to the multiprocess apparatus 10.

In this embodiment, the process controller unit 30 will be described as a separate unit in order to explain its function. However, the process controller unit 30 may be incorporated in the internal apparatus controller 20. Referring to FIG. 1, reference numeral 41 denotes a first terminal which sends internal information of the apparatus to the outside; 42, a second terminal which sends a start signal to the outside; and 43, a third terminal which receives a stop signal from the outside.

The multiprocess apparatus 10 operates under the control of the internal apparatus controller 20. A start signal is sent from the internal apparatus controller 20 in the multiprocess apparatus 10 to the multiprocess apparatus 10 and process controller unit 30 at a timing in a predetermined process sequence. When the start signal is received, the process controller unit 30 judges on the basis of information such as a process gas in the apparatus which one, a deposited film thickness, an oxide film thickness, or a doping amount, should be calculated. Then, the process controller unit 30 actually starts calculating one of the deposited film thickness, the oxide film thickness, or the doping amount.

This process will be described in more detail. Under the control of the internal apparatus controller 20 according to the set sequence, a wafer loading into the multiprocess apparatus 10, a heating up, and a temperature retention are performed. Next, the internal apparatus controller 20 instructs the multiprocess apparatus 10 to supply a process gas and simultaneously sends a start signal to the process controller unit 30. In this case, the starting point is set at the time of start of process gas supply. However, the starting point can be changed in advance in accordance with the purpose by presetting the timing, e.g., to a time after wafer loading into the multiprocess apparatus 10 is finished, before a heating up is started, or when the temperature of inside of the wafer furnace reaches to a predetermined temperature.

In this embodiment, the oxide film thickness is calculated first. Internal information of the apparatus is used for the calculation. As the internal information of the apparatus, temperature information from various thermocouples inside or outside of the furnace, a gas flow rate from a flowmeter, and the like can be used. As a calculation model, a general equation for oxide growth given by, e.g., $$(t_{ox}^2 - \tau^2)/B = t - (B/A)(t_{ox} - \tau) \quad (1)$$

can be used. In equation (1), tox is the oxide film thickness, τ is the initial film thickness, t is the time, B/A is the primary coefficient, and B is the secondary coefficient. For example, τ uses a value of 15 nm, B/A uses a value of $5 \times 10^{-6}$, and B uses a value of $8 \times 10^{-6}$ min/μm.

The temperature and the gas flow rate, which change every moment, are read at a predetermined time interval of, e.g., 1 sec. Using the values, an increment of the oxide film thickness during the time interval is calculated and a total oxide film thickness at that time can be calculated by accumulating increments. Accordingly, a fluctuation in oxide film thickness due to disturbances such as changes in the temperature and the flow rate can be taken into consideration. Such disturbances cannot be taken into consideration in the conventional oxidation method. The time interval is set to 1 sec because if the oxide film thickness should be controlled within ±0.2 nm, the apparatus must be controlled within an accuracy of ±2 sec, then the sampling rate must be less than ±2 sec.

The calculation result of the oxide film thickness is judged by the calculated film thickness judgment function. When the calculated film thickness reaches to a specified film thickness of, e.g., 60 nm, a stop signal is sent from the process controller unit 30 to the internal apparatus controller 20. The internal apparatus controller 20 sends the stop signal to the multiprocess apparatus 10 to stop oxidation.

More specifically, this control corresponds to sending from internal apparatus controller 20 to the multiprocess apparatus 10, e.g., an interrupt instruction "to end the sequence for supplying the oxidation gas and switch to a sequence for supplying the next inert gas". This timing may be set a little before it comes. That is, if there is a case that the oxidation gas cannot immediately be switched to the next gas after output of the stop signal until the end of oxidation, extra oxidation is performed. Expecting this extra oxidation, a slightly smaller value than the target film thickness is to be set as a judgment film thickness.

When an SiN film is to be deposited continuously after formation of the oxide film, the multiprocess apparatus 10 receives the stop signal after the end of oxide film formation and then receives a start signal again from the internal apparatus controller 20. The process controller unit 30 receives the start signal again and judges on the basis of the internal information of the apparatus, such as the process gas, which one, the oxide film thickness, the deposited film thickness, or the doping amount, should be calculated.

In this embodiment, SiN film formation is performed next. Hence, the sequence advances to calculation of the deposited film thickness. Internal information of the apparatus is used for calculation. As the internal information of the apparatus, temperature information from various thermocouples inside and outside of the furnace, a gas flow rate from a flowmeter, a process pressure from a pressure gauge, and the like can be used. The temperature, the gas flow rate, and the process pressure, which change every moment, are read at a predetermined time interval of, e.g., 1 sec. Using the read values, an increment of the deposited film thickness during the time interval is calculated and a total deposited film thickness at that time can be calculated by accumulating increments. Accordingly, a fluctuation in deposited film thickness due to disturbances such as changes in the temperature, the flow rate, and the pressure can be taken into consideration. Such disturbances cannot be taken into consideration in the conventional deposited film thickness control.

The calculation result of the deposited film thickness is judged by the calculated film thickness judgment function. When the calculated film thickness reaches to a specified film thickness of, e.g., 100 nm, a stop signal is sent from the process controller unit 30 to the internal apparatus controller 20. The internal apparatus controller 20 sends the stop signal to the multiprocess apparatus 10 to stop deposition of the SiN film.

More specifically, this control corresponds to sending from the internal apparatus controller 20 to the multiprocess apparatus 10, e.g., an interrupt instruction "to end the sequence for supplying the deposition gas and switch to a sequence for supplying the next inert gas". This timing may be set a little before it comes. That is, if there is a case that the deposition gas cannot immediately be switched to the next gas after the output of the stop signal until the end of deposition, an extra deposition is performed. Expecting this extra deposition, a slightly smaller value than the target film thickness is to be set as a judgment film thickness.

After the deposition gas is switched to the inert gas, a cooling down and a wafer unloading instructions are output from the internal apparatus controller 20 in accordance with a predetermined sequence. The multiprocess apparatus 10 executes these processes, and the process is ended. The variations in film thickness among wafers due to the continuous process occur due to fluctuations in temperature in the furnace, the gas flow rate, the process pressure, and the like, which are uncontrollable before. In the apparatus and the control method of this embodiment, when film thickness calculation is performed in consideration of these fluctuations, and the result is fed back to the process, strict film thickness control with little variation can be performed.

That is, by causing the process controller unit 30 to calculate the quality characteristic in real time on the basis of the internal information of the apparatus and control the process time, very strict control against disturbances can be executed. More specifically, the function of receiving in real time internal information of the apparatus, including the temperature inside of the furnace, the pressure inside of the furnace, and the gas flow rate, and information outside the apparatus such as the atmospheric pressure, the function of converting the received information for values available for calculation, the function of calculating the oxide film thickness, deposited film thickness, impurity diffusion length, and the like in real time, the function of selecting an algorithm (oxidation/deposition/diffusion) for real time calculation, and the function of starting calculation in accordance with a process start signal of the apparatus and outputting a process end signal to the apparatus when a desired film thickness or doping amount is obtained.

Accordingly, the process time can strictly be controlled. Hence, any fluctuation in film thickness due to uncontrollable disturbance factors in the apparatus or any fluctuation in film thickness due to uncontrollable disturbance factors such as the atmospheric pressure outside of the apparatus can be suppressed, and sufficient element device performance and circuit characteristics can be obtained.

Figure 3:
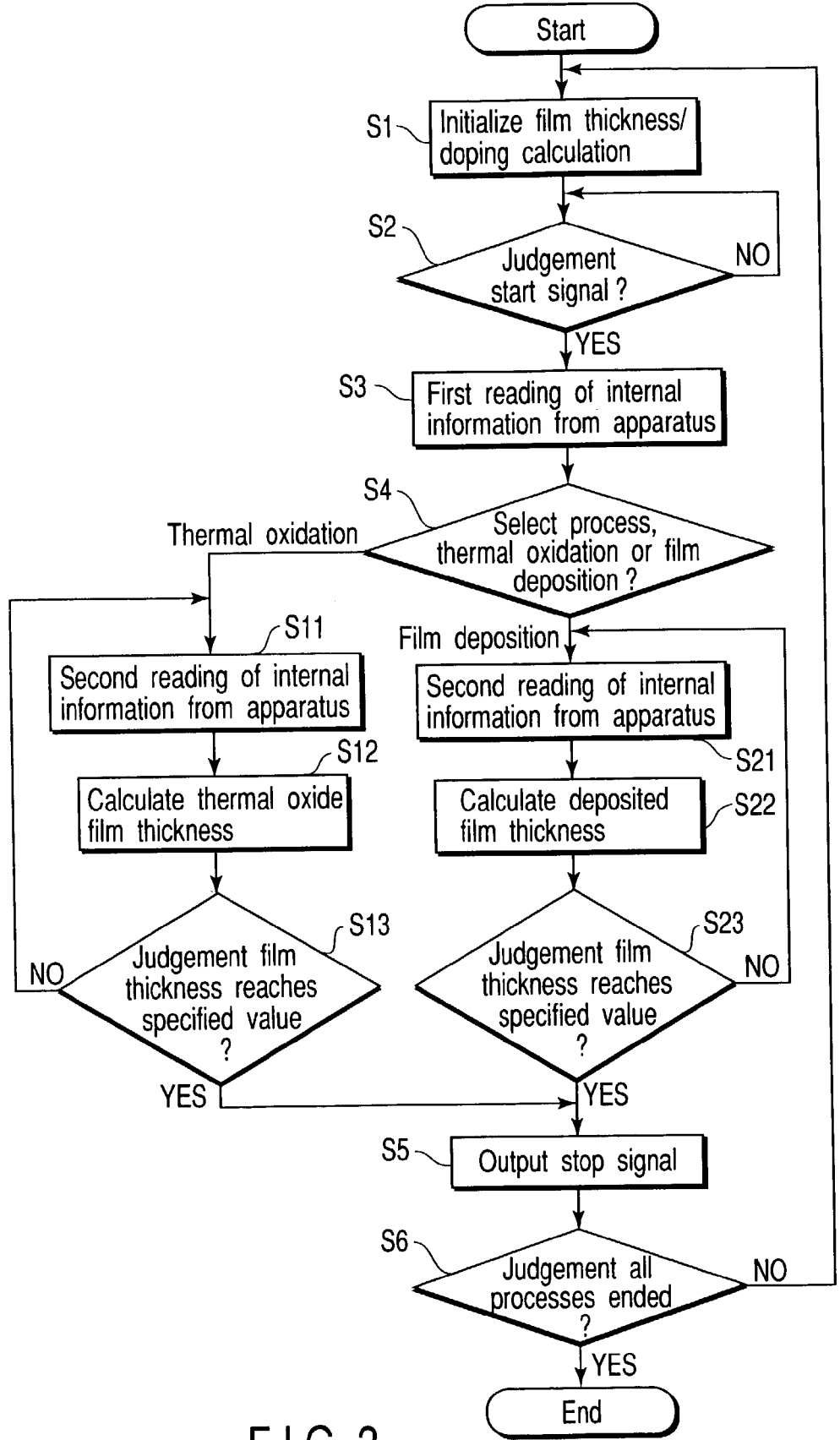
FIG. 3 is a flow chart showing process control operation according to the first embodiment.

FIG. 3 is an arithmetic flow chart in the process controller section 30 according to this embodiment. A method of performing oxide film calculation and deposited film thickness calculation will be described with reference to FIG. 3.

First, film thickness calculation and doping amount calculation are initialized (step S1). Next, the start signal from the internal apparatus controller 20 is monitored (step S2). When the start signal is output, the internal information of the apparatus is received (step S3). It is judged which one, the oxide film thickness calculation or the deposited film thickness calculation should be performed (step S4).

In this embodiment, oxide film thickness calculation is performed first (step S12). It is judged whether the calculated oxide film thickness exceeds the specified value, and in this case, 60 nm (step S13). If NO in step S13, the process waits for another 1 sec from the preceding internal information acquisition, and then, the internal information is acquired again (step S1), and oxide film thickness calculation is performed in step S12 again. This process is repeated. When the calculated oxide film thickness exceeds 60 nm, a stop signal is sent to the internal apparatus controller 20 (step S5). It is judged whether all processes are ended (step S6). If another process remains, the flow returns to the start.

In this example, assume that control is performed at an interval of 1 sec. Whether the internal information of the apparatus can be acquired at the interval of 1 sec, whether oxidation calculation or calculated film thickness judgment can be done, and the like can be factors that impede implementation. However, with the current apparatus performance and calculation speed of the computer, no practical obstacles are present.

After the oxide film thickness calculation, a film thickness calculation and a doping amount calculation are initialized in step S1. In step S2, the start signal is monitored. When the start signal is output, the internal information of the apparatus is received in step S3. It is judged in step S4 which one, the oxide film thickness calculation or the deposited film thickness calculation, should be performed.

This time, a SiN deposited film thickness is calculated (step S22). It is judged whether the calculated deposited film thickness exceeds the specified value, and in this case, 100 nm (step S23). If NO in step S23, the process waits for another 1 sec from the preceding internal information acquisition, and then, the internal information is acquired again (step S21), and deposited film thickness calculation is performed in step S22. This process is repeated. When the calculated deposited film thickness exceeds 100 nm, a stop signal is sent to the internal apparatus controller 20 in step 5. If it is judged in step S6 that all processes are ended, the process is ended.

The arithmetic flow chart in the process controller unit 30 according to this embodiment has been described above.

Figure 4A:
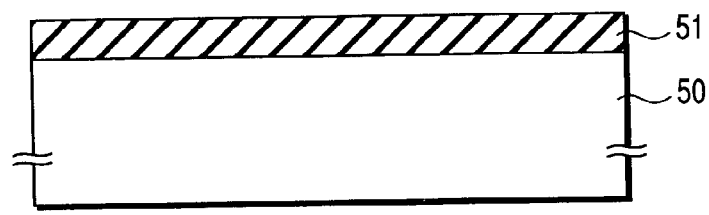
FIGS. 4A and 4B are sectional views showing steps in semiconductor manufacturing according to the first embodiment.
Figure 4B:
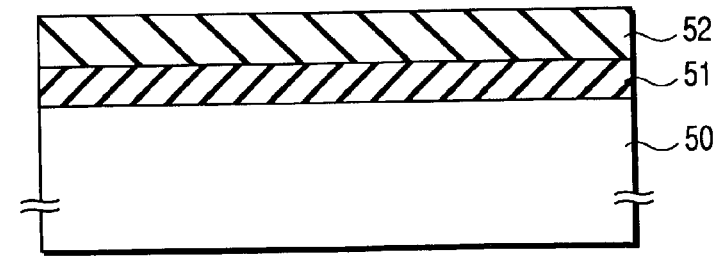

FIG. 4A is a sectional (view) showing a state wherein an $SiO_2$ film 51 is formed on an Si substrate 50 in the multiprocess apparatus 10 by steps S2 to S5 of the first cycle. FIG. 4B is a sectional (view) showing a state wherein an SiN film 52 is formed on the $SiO_2$ film 51 in the multiprocess apparatus 10 by steps S2 to S5 of the second cycle. Both film thicknesses could be accurately controlled.

As described above, according to this embodiment, the process controller unit 30 is arranged to monitor in real time the oxidation process and deposition process in the multiprocess apparatus 10 and control the process time. Accordingly, the process variation for each wafer in the continuous processing can be reduced. In addition, the accuracy of calculation for the plurality of processes can be improved. For an oxide film thickness, 0.1-nm order film thickness control can be performed. Furthermore, since the gate oxide film and a poly-Si silicon film for an electrode can be continuously formed, the yield and reliability of devices can greatly be increased.

Second Embodiment

In the first embodiment, the continuous formation process of oxide film formation and SiN film deposition has been exemplified. In this embodiment, an example of a continuous process of As vapor phase diffusion and a thermal oxidation will be described. The apparatus arrangement of the semiconductor manufacturing apparatus is the same as in FIG. 1.

In this embodiment, a doping amount calculation is performed first. Internal information of the apparatus is used for calculation. As the internal information of the apparatus, temperature information from various thermocouples inside and outside of the furnace, a gas flow rate from a flowmeter, a process pressure from a pressure gauge, and the like can be used. The temperature, the gas flow rate, and the process pressure, which change every moment, are read at a predetermined time interval of, e.g., 1 sec. Using the values, an increment in doping amount during a time interval is calculated and a total doping amount at that time can be calculated by accumulating increments. Accordingly, a fluctuation in doping amount due to disturbances such as changes in the temperature or the flow rate can be taken into consideration. Such disturbances cannot be taken into consideration in the conventional vapor phase diffusion method.

The calculation result of the doping amount is judged by the calculated doping amount judgment function. When the calculated doping amount reaches to a specified doping amount of, e.g., $1\times10^{20}$ atoms/cm$^2$, a stop signal is sent from the process controller unit 30 to the internal apparatus controller 20. The internal apparatus controller 20 sends the stop signal to the multiprocess apparatus 10 to stop the vapor phase diffusion process.

More specifically, this control corresponds to sending an interrupt instruction from the internal apparatus controller 20 to the multiprocess apparatus 10, e.g., the interrupt instruction is "to end the sequence for supplying the doping gas and switch to a sequence for supplying the next inert gas". This timing may be set a little before it comes. That is, if there is a case that the doping gas cannot immediately be switched to a next inert gas after the output of the stop signal until the end of vapor phase diffusion, extra vapor phase diffusion is performed. Expecting this extra vapor phase diffusion, a slightly smaller value than the target doping amount is to be set as a judgment doping amount.

When an oxide film is to be formed continuously after the vapor phase diffusion, the process controller unit 30 receives the stop signal after the end of vapor phase diffusion and then receives a start signal again from the internal apparatus controller 20. The process controller unit 30 receives the signal and judges on the basis of the internal information of the apparatus, such as the process gas, which one, the oxide film thickness, the deposited film thickness, or the doping amount, should be calculated. In this embodiment, oxide film formation is performed next. Hence, the sequence advances to the oxide film thickness calculation algorithm. Internal information of the apparatus is used for calculation, as in the first embodiment. As the calculation model, equation (1) can be used.

The temperature and gas flow rate, which change every moment, are read at a predetermined time interval of, e.g., 1 sec. Using the values, an increment of the oxide film thickness during a time interval is calculated and total oxide film thickness at that time is calculated by accumulating increments. Accordingly, a fluctuation in the oxide film thickness due to disturbances such as changes in the temperature and the flow rate can be taken into consideration.

Such disturbances cannot be taken into consideration in the conventional oxidation method. The time interval is set to 1 sec because if the oxide film thickness should be controlled within ±0.2 nm, the apparatus must be controlled within an accuracy of ±2 sec, and the sampling rate must be less than ±2 sec.

The calculation result of the oxide film thickness is judged by the calculated film thickness judgment function. When the calculated film thickness reaches to a specified film thickness of, e.g., 60 nm, a stop signal is sent from the process controller unit 30 to the internal apparatus controller 20. The internal apparatus controller 20 sends the stop signal to the multiprocess apparatus 10 to stop the oxidation.

More specifically, this control corresponds to sending an interrupt instruction from internal apparatus controller 20 to the oxidation furnace, e.g., an interrupt instruction is "to end the sequence for supplying the oxidation gas and switch to a sequence for supplying the next inert gas". This timing may be set a little before it comes. That is, if there is a case that the oxidation gas cannot immediately be switched to the next gas after the output of the stop signal until the end of oxidation, extra oxidation is performed. Expecting this extra oxidation, a slightly smaller value than the target film thickness is set as a judgment film thickness.

The fluctuation in film thickness and doping amount among wafers in the continuous process occur due to small changes in the temperature in the furnace, the gas flow rate, the process pressure, and the like, which are uncontrollable before. In the apparatus and control method of this embodiment, when film thickness calculation is performed in consideration of these variations, and the result is fed back to the process, strict film thickness control with little variation can be performed.

FIG. 5 is an arithmetic flow chart in the process controller unit 30 according to this embodiment. A method of performing deposited film thickness calculation and doping amount calculation will be described with reference to FIG. 5.

First, film thickness calculation and doping amount calculation are initialized (step S1). Next, the start signal from the internal apparatus controller 20 is monitored (step S2). When the start signal is output, the internal information of the apparatus is received (step S3). It is judged which one, oxide film thickness calculation or doping amount calculation, should be performed (step S4).

In this embodiment, doping amount calculation is performed first (step S32). It is judged whether the calculated doping amount exceeds the specified value, and in this case, $1 \times 10^{20}$ atoms/cm$^2$ (step S33). If NO in step S33, the process waits for another 1 sec from the preceding internal information acquisition, and then, the internal information is acquired again (step S31), and doping amount calculation is performed in step S32. This process is repeated. When the calculated doping amount exceeds $1 \times 10^{20}$ atoms/cm$^2$, a stop signal is sent to the internal apparatus controller 20 (step S5), and the flow returns to the start.

In this example, assume that control is performed at an interval of 1 sec. Whether the internal information of the apparatus can be acquired at the interval of 1 sec, whether doping amount calculation or calculated doping amount judgment can be done, and the like can be factors that impede implementation. However, with the current apparatus performance and calculation speed of the computer, no practical obstacles are present.

After the doping amount calculation, the film thickness calculation and the doping amount calculation are initialized in step S1. In step S2, the start signal is monitored. When the start signal is output, the internal information of the apparatus is received in step S3. It is judged in step S4 which one, oxide film thickness calculation, doping amount calculation, or deposited film thickness calculation, should be performed. This time, oxide film thickness is calculated (step S12). It is judged whether the calculated oxide film thickness exceeds the specified value, and in this case, 60 nm (step S13). If NO in step S13, the process waits for another 1 sec from the preceding internal information acquisition, and then, the internal information is acquired again (step S11), and oxide film thickness calculation is performed in step S12. This process is repeated. When the calculated oxide film thickness exceeds 60 nm, a stop signal is sent to the internal apparatus controller 20 (step S5). If it is judged in step S6 that all processes are ended, the process is ended.

The arithmetic flow chart in the process controller unit 30 according to this embodiment has been described above. The flow chart is different from the first embodiment only in the types and order of processes.

Figure 6A:
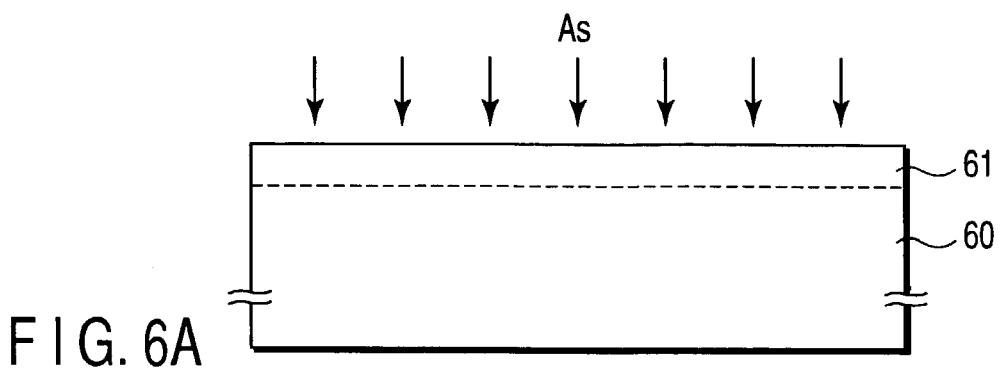
FIGS. 6A and 6B are sectional views showing steps in semiconductor manufacturing according to the second embodiment.
Figure 6B:
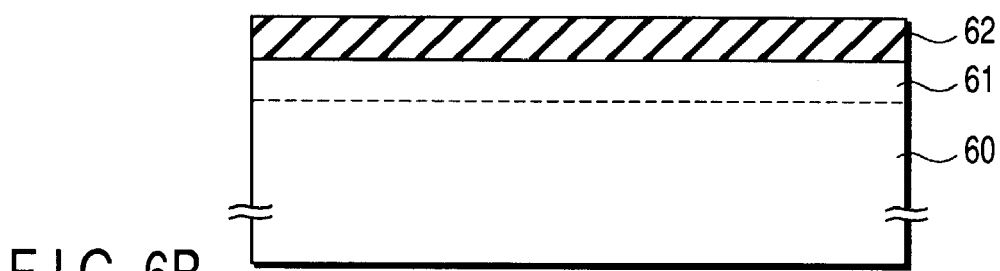
Figure 7:
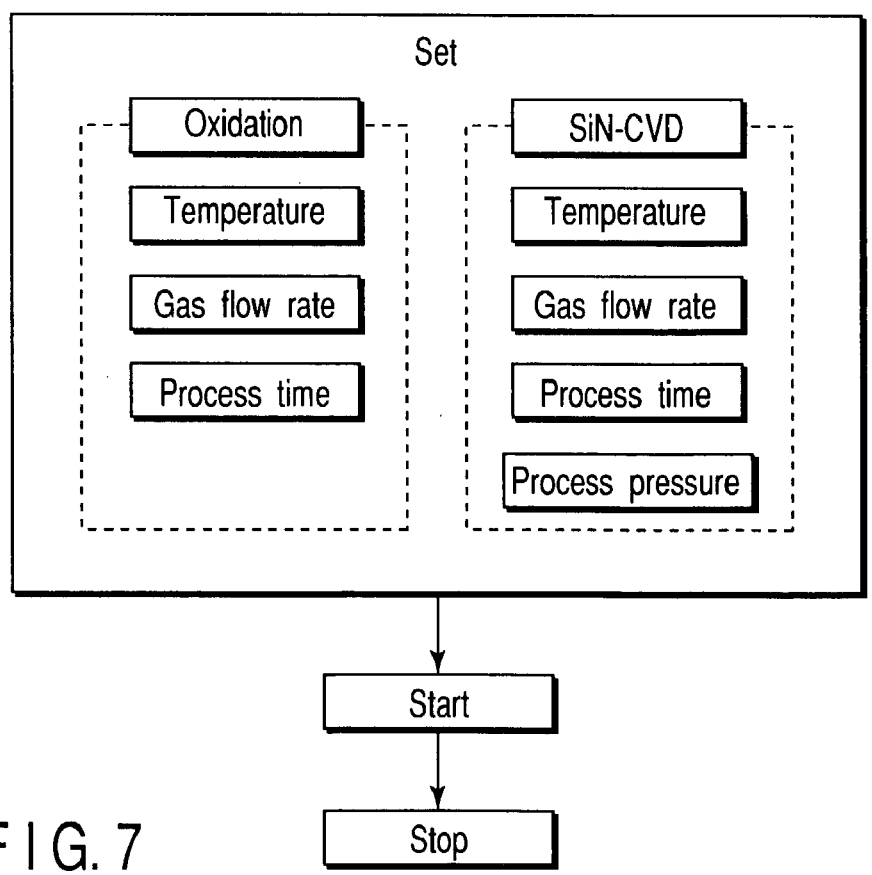
FIG. 7 is a conceptual view showing a conventional (oxide film+SiN film) continuous formation process.

FIG. 6A is a sectional view showing a state wherein an As diffusion layer 61 is formed on an Si substrate 60 in the multiprocess apparatus 10 by steps S2 to S5 of the first cycle. FIG. 6B is a sectional view showing a state wherein an SiO$_2$ film 62 is formed on the Si substrate 60 in the multiprocess apparatus 10 by steps S2 to S5 of the second cycle. Both the depth of the diffusion layer 61 and the film thickness of the SiO$_2$ film 62 could be accurately controlled.

According to this embodiment, the process controller unit 30 is arranged to monitor in real time the diffusion process and the oxidation process in the multiprocess apparatus 10 and controls the process time. Hence, the same effect as in the above-described first embodiment can be obtained, as a matter of course. In addition, even when the process state is difficult to calculate, like an ion implantation without reaction, accurate calculation can be performed.

(Modification)

The present invention is not limited to the above-described embodiments. In the embodiments, the dedicated process controller unit is arranged for the multiprocess apparatus. However, the function of the process controller unit may be implemented by an external computer. The process controller unit performs calculation on the basis of internal information of the apparatus. However, the calculation may be done on the basis of external information such as the atmospheric pressure as well as the internal information of the apparatus. In addition, the processes are not limited to oxidation/diffusion/CVD. The present invention can be applied to various processes used to manufacture a semiconductor device.

Also, various changes and modifications can be made within the spirit and scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor manufacturing apparatus comprising:
 a processing apparatus main body which continuously executes a plurality of processes related to manufacturing of a semiconductor device in a single chamber;
 means to determine in real time internal process information for each of the plurality of processes by measuring at least one of a pressure, temperature, mass flow, voltage, current, and plasma charge of the processing apparatus main body, an apparatus controller unit which selects a type of process in the processing apparatus main body to be performed on the semiconductor device being processed within the processing apparatus main body and supplies to the processing apparatus main body a start signal to start a process and a stop signal to stop the process; and a process controller unit, coupled to receive the start signal and the internal process information, to periodically calculate in real time a physical characteristic of the semiconductor device being processed for each of said plurality of processes on the basis of the internal process information of the processing apparatus main body, wherein the process controller unit starts calculating for the current process the physical characteristic of the semiconductor device being processed at a timing when the start signal is sent from the apparatus controller unit, and sends the stop signal to the apparatus controller unit when a currently calculated value of the physical characteristic of the semiconductor device being processed reaches a predetermined value, wherein the apparatus controller unit sends the stop signal to the processing apparatus main body upon receiving the stop signal from the process controller unit, stops the current process by the processing apparatus main body, and switches to a next process.

2. A semiconductor manufacturing apparatus according to claim 1, wherein the process controller unit has a function to judge using the internal process information of the processing apparatus main body which physical characteristic should be calculated.

3. A semiconductor manufacturing apparatus according to claim 1, wherein the process controller unit receives external information of the processing apparatus main body together with the internal process information of the processing apparatus main body and calculates the physical characteristic of the semiconductor device being processed using the external information and the internal process information.

4. A semiconductor manufacturing apparatus according to claim 3, wherein the internal process information of the processing apparatus main body received by the process controller unit includes a temperature, pressure, and gas flow rate, and the external information of the processing apparatus main body received by the process controller unit includes an atmospheric pressure.

5. A semiconductor manufacturing apparatus according to claim 1, wherein the processing apparatus main body has a heating mechanism.

6. A semiconductor device manufacturing apparatus according to claim 1, wherein the processing apparatus main body continuously executes at least two processes of oxidation, CVD, and diffusion.

7. The semiconductor manufacturing apparatus of claim 1, wherein the function of the process controller unit of calculating the physical characteristic of the semiconductor device being processed includes a function of calculating at least one of an oxide film thickness, a deposited film thickness, and a doping amount.

8. The semiconductor manufacturing apparatus of claim 1, wherein the physical characteristic is a film thickness determined by calculating a film-forming reaction or a diffusion determined by calculating a diffusion reaction.

9. A semiconductor device manufacturing method of executing a predetermined process for a substrate to be processed using a semiconductor manufacturing apparatus comprising a processing apparatus main body which continuously executes a plurality of processes related to manufacturing of a semiconductor device in a single chamber, an apparatus controller unit which selects a type of process in the processing apparatus main body to be performed on the substrate and controls a start and stop of the process, and a process controller unit which receives the start signal and internal process information of the processing apparatus main body and periodically calculates in real time a physical characteristic of the substrate for each of said plurality of processes on the basis of the internal process information of the processing apparatus main body, said method comprising:

while the substrate to be processed is set in the processing apparatus main body, causing the apparatus controller unit to start the predetermined process, causing the internal process information to be determined in real time for each of the plurality of processes by measuring at least one of a pressure, temperature, mass flow, voltage, current, and plasma charge of the processing apparatus main body, causing the process controller unit to start calculating a physical characteristic of the substrate for the current process, and when the process controller unit judges on the basis of a calculation result that the physical characteristic of the substrate reaches a predetermined value, causing the apparatus controller unit to stop the current process and switch to a next process.

10. A semiconductor device manufacturing method according to claim 9, wherein the process controller unit has a function of determining, using the internal process information of the processing apparatus main body, which physical characteristic of the substrate should be calculated.

11. A semiconductor device manufacturing method according to claim 9, wherein the process controller unit receives external information of the processing apparatus main body together with the internal process information of the processing apparatus main body and calculates the physical characteristic of the substrate using the external information and internal process information.

12. A semiconductor device manufacturing method according to claim 11, wherein the internal process information of the processing apparatus main body received by the process controller unit includes a temperature, pressure, and gas flow rate, and the external information of the processing apparatus main body received by the process controller includes an atmospheric pressure.

13. A semiconductor device manufacturing method according to claim 9, wherein the processing apparatus main body has a heating mechanism.

14. A semiconductor manufacturing apparatus according to claim 9, wherein the processing apparatus main body continuously executes at least two processes of oxidation, CVD, and diffusion.

15. The semiconductor device manufacturing method of claim 9, wherein the function of the process controller unit of calculating the physical characteristic of the substrate being processed includes a function of calculating at least one of an oxide film thickness, a deposited film thickness, and a doping amount.

16. The semiconductor device manufacturing method of claim 9, wherein the physical characteristic is a film thickness determined by calculating a film-forming reaction or a diffusion determined by calculating a diffusion reaction.

* * * * *